(12) United States Patent
Romanelli et al.

(10) Patent No.: US 8,942,837 B2
(45) Date of Patent: Jan. 27, 2015

(54) METHOD FOR INSPECTING A MANUFACTURING DEVICE

(75) Inventors: James Romanelli, Colchester, CT (US); Jeffrey S. Beattie, South Glastonbury, CT (US); Jesse R. Boyer, Manchester, CT (US); Robert E. Erickson, Storrs, CT (US); Randall W. Joyner, Union, CT (US); Daniel A. Snyder, Manchester, CT (US); David A. Krause, Tolland, CT (US); Kun Tong, West Hartford, CT (US)

(73) Assignee: United Technologies Corporation, Hartfod, CT (US)

( * ) Notice: Subject to any disclaimer, the term of this patent is extended or adjusted under 35 U.S.C. 154(b) by 494 days.

(21) Appl. No.: 13/417,990

(22) Filed: Mar. 12, 2012

(65) Prior Publication Data

US 2013/0238109 A1    Sep. 12, 2013

(51) Int. Cl.
*G06F 19/00*       (2011.01)
(52) U.S. Cl.
USPC ............... 700/97; 700/109; 700/110; 702/35
(58) Field of Classification Search
USPC .............................. 700/97, 109, 110; 702/35
See application file for complete search history.

(56) References Cited

U.S. PATENT DOCUMENTS

| | | | |
|---|---|---|---|
| 5,424,634 A * | 6/1995 | Goldfarb et al. | ......... 324/763.01 |
| 6,271,924 B1 | 8/2001 | Ngoi et al. | |
| 7,149,677 B2 * | 12/2006 | Jayaram et al. | ................. 703/22 |
| 7,162,319 B2 * | 1/2007 | Popp et al. | ..................... 700/110 |
| 7,327,857 B2 * | 2/2008 | Lloyd et al. | .................... 382/106 |
| 7,463,368 B2 * | 12/2008 | Morden et al. | ................ 356/614 |
| 7,474,407 B2 | 1/2009 | Gutin | |
| 7,573,586 B1 | 8/2009 | Boyer et al. | |
| 7,612,893 B2 | 11/2009 | Kuchel | |
| 7,869,026 B2 | 1/2011 | Boyer et al. | |
| 2003/0130758 A1 * | 7/2003 | Hirano et al. | ................. 700/182 |
| 2005/0066739 A1 * | 3/2005 | Gotkis et al. | .................... 73/760 |
| 2008/0015827 A1 * | 1/2008 | Tryon et al. | ....................... 703/2 |
| 2009/0033947 A1 | 2/2009 | Boyer et al. | |
| 2009/0089020 A1 | 4/2009 | Boyer et al. | |

(Continued)

FOREIGN PATENT DOCUMENTS

| | | |
|---|---|---|
| JP | 2003-093190 | 12/2003 |
| JP | 2004-093190 | 3/2004 |
| JP | 2007-333462 | 12/2007 |

(Continued)

OTHER PUBLICATIONS

"Robotic Scanning Using a White Light Scanner", Klaas et al, Quality Digest, Aug. 24, 2009.*

(Continued)

*Primary Examiner* — Michael D Masinick
(74) *Attorney, Agent, or Firm* — O'Shea Getz P.C.

(57) ABSTRACT

A method is provided for inspecting a plurality of parts with an electronic measurement device and a processing system. The method includes a step of creating surface geometry maps of the parts utilizing the electronic measurement device, where each part was manufactured utilizing the manufacturing device. Geometric part models of the parts are generated from the surface geometry maps. The part models can subsequently be analyzed to determine whether a manufacturing device that manufactured the plurality of parts manufactures parts that comply with a part design specification.

4 Claims, 3 Drawing Sheets

(56) References Cited

U.S. PATENT DOCUMENTS

2009/0254286 A1* 10/2009 Tulyani et al. .................. 702/34
2010/0296725 A1 11/2010 Seiffert

FOREIGN PATENT DOCUMENTS

JP 2009-264956 11/2009
KR 10-2009-0039942 4/2009

OTHER PUBLICATIONS

International search report for PCT/US2013/030508 dated Jun. 24, 2013.

* cited by examiner

METHOD FOR INSPECTING A MANUFACTURING DEVICE

BACKGROUND OF THE INVENTION

1. Technical Field

This disclosure relates generally to methods for inspecting a manufacturing device and, more particularly, to methods for inspecting a manufacturing device by inspecting a plurality of parts that have been manufactured by the device.

2. Background Information

Various qualification methods are known for determining whether, for example, a rotor blade casting die can form a rotor blade that complies with a blade design specification. The blade design specification may include information regarding geometry and/or structural properties of the rotor blade.

A typical qualification method for a rotor blade casting die includes a step of creating a surface geometry map of at least one rotor blade, formed by the die, with a mechanical contact measuring device. Data from the surface geometry map is analyzed to determine whether dimensions of the rotor blade are within tolerance of the geometry designated in the blade design specification. Such a qualification method, however, can be relatively time consuming since the mechanical contact measuring device measures one data point at a time.

SUMMARY OF THE DISCLOSURE

According to a first aspect of the invention, a method is provided for inspecting a plurality of parts with an electronic measurement device and a processing system. The method includes steps of: (a) creating surface geometry maps of a plurality of parts utilizing the electronic measurement device, where each part was, e.g., manufactured utilizing the manufacturing device; (b) generating geometric part models of the parts utilizing the surface geometry maps; (c) comparing each of the part models to a geometric reference model to provide model comparison data indicative of geometric differences between the models; (d) processing the model comparison data to determine deviation between the part models and the reference model; and (e) evaluating the deviation to determine whether the deviation satisfies one or more predetermined geometric tolerances, where the steps of generating, comparing, processing and evaluating are performed by the processing system.

According to a second aspect of the invention, another method is provided for inspecting a plurality of parts with an electronic measurement device and a processing system. The method includes steps of: (a) creating surface geometry maps of a plurality of parts utilizing the electronic measurement device, where each part was, e.g., manufactured utilizing the manufacturing device; (b) generating geometric part models of the parts utilizing the surface geometry maps; (c) structurally analyzing at least some of the parts utilizing the respective part model to provide stress data indicative of at least one of a thermal stress distribution and a mechanical stress distribution for the respective parts; and (d) evaluating the stress data to determine whether at least one of the thermal stress distribution and the mechanical stress distribution satisfies one or more predetermined stress tolerances, where the steps of generating, analyzing and evaluating are performed by the processing system.

According to a third aspect of the invention, another method is provided for inspecting a plurality of parts with an electronic measurement device and a processing system. The method includes steps of: (a) creating surface geometry maps of the parts utilizing the electronic measurement device; (b) comparing the surface geometry maps to one another to provide an averaged surface geometry map; (c) generating an averaged geometric part model utilizing the averaged surface geometry map; (d) comparing the averaged geometric part model to a geometric reference model to provide model comparison data indicative of geometric differences between the models; and (e) evaluating the model comparison data to determine whether one or more of the geometric differences between the models respectively satisfy one or more predetermined geometric tolerances, where the steps of comparing, generating and evaluating are performed by the processing system.

The foregoing features and the operation of the invention will become more apparent in light of the following description and the accompanying drawings.

DETAILED DESCRIPTION OF THE INVENTION

The present invention includes a method for inspecting a manufacturing device and a method for inspecting a plurality of parts manufactured with the manufacturing device. An example of a manufacturing device is a die (e.g., a casting die, a forging die, etc.) for manufacturing a part such as a hollow rotor blade for a gas turbine engine. Other examples of manufacturing devices include molds, stamping tools, etc. Briefly, the manufacturing device can be inspected, for example, by inspecting the plurality of parts that have been manufactured utilizing the manufacturing device. The parts can be inspected with an electronic measurement device that includes, for example, a non-contact sensor that can measure a plurality of data points on a surface of one of the parts substantially simultaneously. In this manner, the method can relatively quickly determine whether the manufacturing device manufactures parts that comply with a part design specification. The part design specification designates a set of geometric and/or structural design parameters that the parts are designed to exhibit. A geometric tolerance for a dimension of a feature (e.g., a radius of a fillet) on the part is an example of a geometric design parameter. A stress tolerance (e.g., a minimum mechanical or thermal stress tolerance) for a feature of the part is an example of a structural design parameter.

Figure 1:
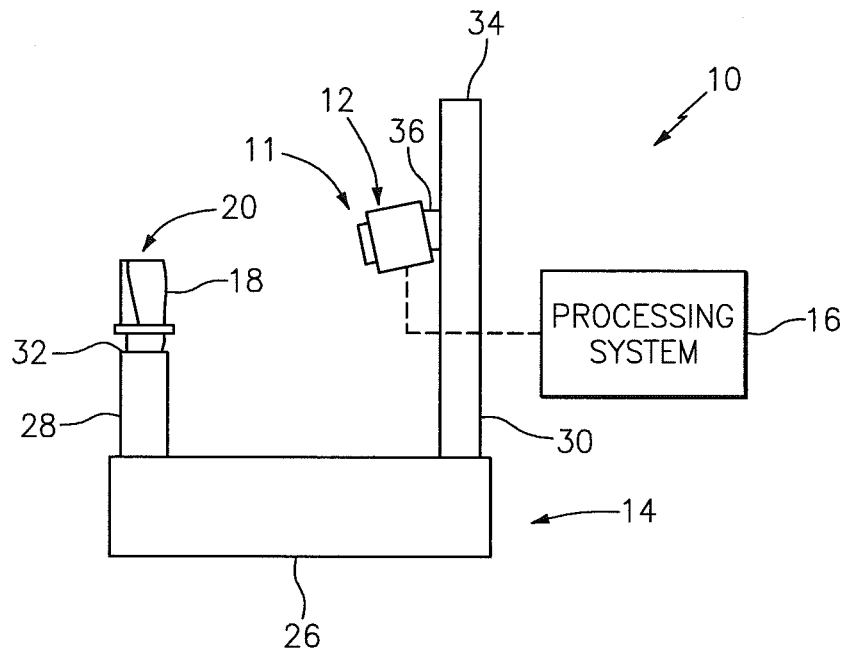
FIG. 1 is a diagrammatic illustration of a system for inspecting a manufacturing device.

FIG. 1 illustrates a system 10 adapted to perform the aforesaid inspection methods. The system 10 includes an electronic measurement device 11, a support stand 14 and a processing system 16.

Figure 2:
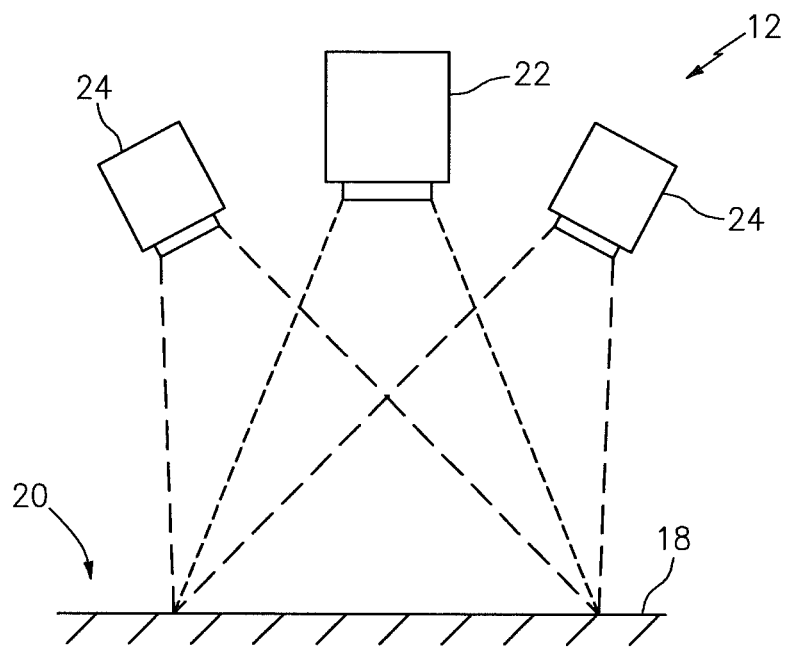
FIG. 2 is a diagrammatic illustration of a non-contact sensor included in the system illustrated in FIG. 1.

Referring to FIGS. 1 and 2, the electronic measurement device 11 can include a non-contact sensor 12 (e.g., a white light optical scanner) adapted to map at least a portion of a surface 18 of a part 20. The term "map" is used herein to describe a process of applying a (e.g., high density) triangulated mesh of surface data points to a part surface. In the embodiment shown in FIG. 2, the non-contact sensor 12 includes a fringe pattern projector 22 and one or more cameras 24. The projector 22 is adapted to project a point, line and/or pattern of light (e.g., white light). Each camera 24 is adapted to capture an image of the projected light. An example of such a projector and cameras is disclosed in U.S. Patent Application Publication No. 2009/0033947, which is hereby incorporated by reference in its entirety. Other examples of a non-contact sensor may include a laser scanning device, a blue light optical scanner, a computed axial tomography scanning (CAT Scan) device, etc. In alternate embodiments, the electronic measurement device 11 can include a contact sensor such as, for example, a coordinate measuring machine (CMM).

Referring again to FIG. 1, the support stand 14 includes a base 26, a part support 28 and a sensor support 30. The part support 28 extends from the base 26 to a part support surface 32. The sensor support 30 extends from the base 26 to a first end 34. The sensor support 30 includes a sensor mount 36 disposed axially between the base 26 and the first end 34, which connects the non-contact sensor 12 to the sensor support 30.

The processing system 16 can be implemented using hardware, software, or a combination thereof. The hardware can include one or more processors, a memory, analog and/or digital circuitry, etc. The processing system 16 is in signal communication (e.g., hardwired or wirelessly connected) with the non-contact sensor 12.

Figure 3:
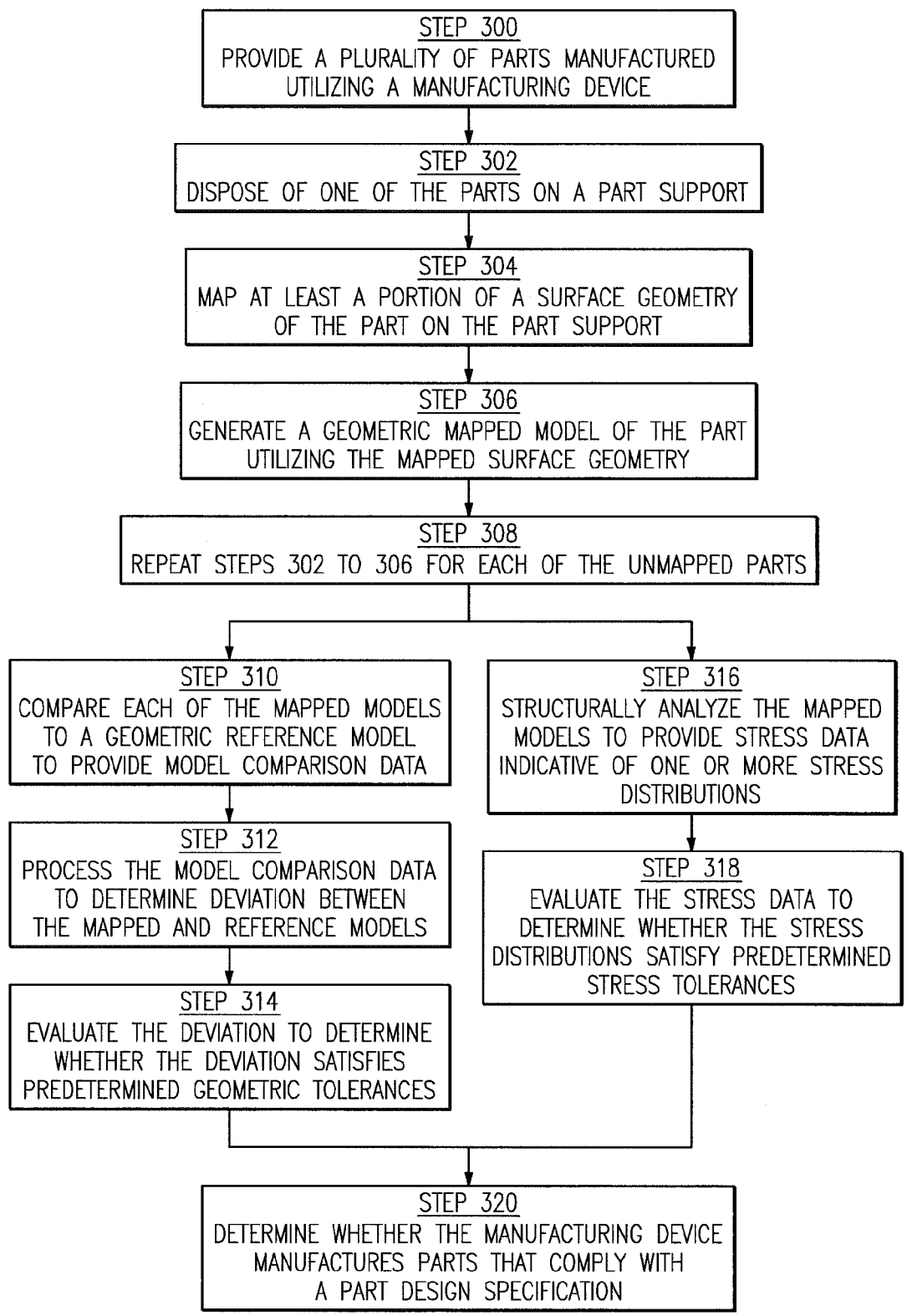
FIG. 3 is a flow diagram of a method for inspecting a manufacturing device.

FIG. 3 is a flow diagram of a method for inspecting a manufacturing device. In step 300, a plurality of parts (e.g., twenty-five or more parts) are provided that were manufactured utilizing the manufacturing device.

Referring to FIGS. 1 and 3, in step 302, one of the parts 20 is disposed on the part support surface 32.

In step 304, the processing system 16 signals the non-contact sensor 12 to create a surface geometry map of the part 20 disposed on the part support surface 32. Referring to FIG. 2, for example, the projector 22 can project a pattern of alternating parallel light (e.g., white, or any other suitable color) and dark (e.g., black) lines onto the surface 18 of the part 20. The lines may be distorted by contours, edges and/or other features (e.g., apertures) of the part surface 18. Images of the lines on the part surface 18 are captured by the cameras 24, and processed by the processing system 16 (see FIG. 1) to provide a surface geometry map (e.g., a 3D contour plot) of the part 20. The surface geometry map includes a triangulated mesh of surface points that locate corresponding points on the part surface 18 in three-dimensional space. In some embodiments, the triangulated mesh of surface points can be normalized to a predetermined reference coordinate space.

Referring again to FIGS. 1 and 3, in step 306, the processing system 16 generates a geometric part model of the part 20 utilizing the surface geometry map. The part model can be generated, for example, by performing a surface fitting to the triangulated mesh of normalized surface points. The present invention, however, is not limited to such a surface fitting technique.

In step 308, steps 302 to 306 are repeated for each of the unmapped parts such that a geometric part model is generated sequentially for each of the parts.

In step 310, the processing system 16 compares each of the part models to a geometric reference model (e.g., a predetermined geometric model of the parts as they are designed). Certain data points from each of the part models, for example, can be spatially compared to corresponding data points from the reference model to provide model comparison data. The model comparison data is indicative of geometric differences between the part models and the reference model (e.g., spatial differences between corresponding model data points).

Figure 4:
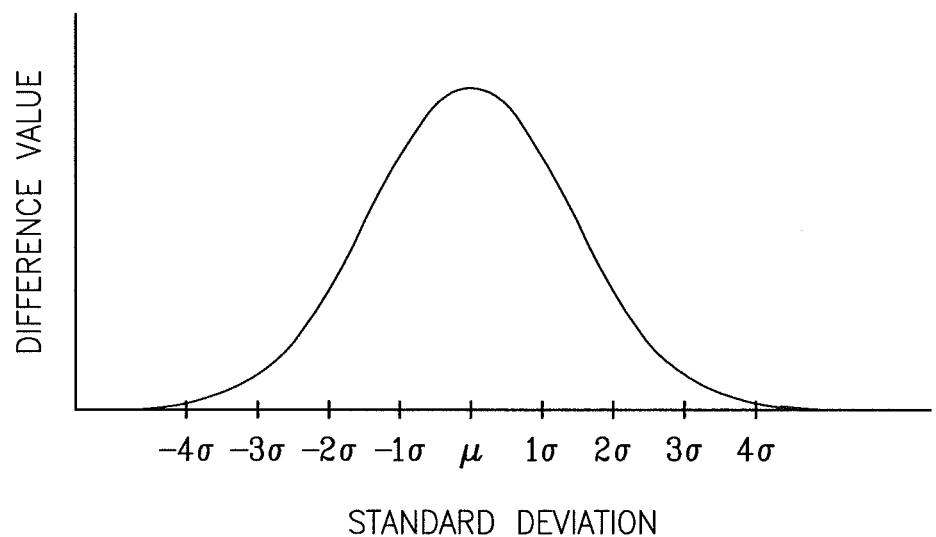
FIG. 4 is a statistical normal distribution comparing geometric differences between each of a plurality of part models and a reference model at a certain data point.

In step 312, the processing system 16 processes the model comparison data to determine deviation between the part models and the reference model. The model comparison data is processed, for example, by statistically comparing the geometric differences between the models at corresponding model data points using statistical normal distributions (e.g., bell curves), each having a probability density function. Data from the normal distributions can subsequently be analyzed to determine the deviation. Referring to FIG. 4, the deviation can be an upper and/or a lower fourth standard deviation (e.g., +/−4σ) to account for, for example, manufacturing device wear, etc. Alternatively, the data can be processed utilizing a process capability ratio (CPK) method, a mean deviation method, etc.

Referring again to FIGS. 1 and 3, in step 314, the processing system 16 evaluates the deviation between the part models and the reference model to determine whether the deviation satisfies predetermined geometric tolerances designated by the part design specification. The predetermined geometric tolerances include one or more lower (e.g., minimum) tolerance values and/or one or more upper (e.g., maximum) tolerance values. The deviation satisfies the predetermined geometric tolerances where, for example, values of the fourth standard deviation are greater than respective lower tolerance values, and less than respective upper tolerance values. The deviation may not satisfy the predetermined geometric tolerances, however, where the fourth standard deviation values are less than respective lower tolerance values, or greater than respective upper tolerance values.

In step 316, the processing system 16 structurally analyzes each of the parts 20 utilizing the respective part model to provide stress data. A finite element analysis (FEA), for example, may be performed on each respective part model using one or more predetermined operating conditions (e.g., rotational speed, operating temperature, forces subjected thereon, etc.) to determine the stress data. Alternatively, the processing system 16 may collectively process one or more of the part models to provide an average structural analysis for a respective grouping of the parts. The stress data may be indicative of, for example, a thermal stress distribution and/or a mechanical stress distribution that the parts 20 may be subjected to during use. In embodiments where the part 20 is a rotor blade, for example, the stress data can be indicative of a thermal stress distribution and a mechanical stress distribution, which the blade is subject to when a gas turbine engine is being operating at full throttle.

In step 318, the processing system 16 evaluates the stress data to determine whether the stress distributions satisfy predetermined stress tolerances designated by the part design specification. The predetermined stress tolerances may include, for example, one or more thermal stress tolerance values, and/or one or more mechanical stress tolerance values. The thermal stress distribution satisfies the predetermined stress tolerances where, for example, thermal stress values from the thermal stress distribution are less than corresponding thermal stress tolerance values. Similarly, the mechanical stress distribution satisfies the predetermined stress tolerances where, for example, mechanical stress values from the mechanical stress distribution are less than corresponding mechanical stress tolerance values.

In step 320, the processing system 16 determines whether the manufacturing device manufactures parts 20 that comply with the part design specification. The parts are determined to comply with the part design specification, for example, where the deviation satisfies the geometric tolerances and/or the stress distributions satisfy the stress tolerances.

In alternate embodiments, the processing system can compare the surface geometry maps of a plurality of the parts to provide an averaged surface geometry map. Values for certain data points from each of the surface geometry maps, for example, can be respectively processed (e.g., averaged) to provide averaged values thereof. Examples of a value can include (i) a measurement value indicative of a measured coordinate of a surface point on the part, (ii) a statistical deviation (e.g., a standard deviation) between the measured coordinate and a respective reference coordinate (e.g., included in the part design specification), (iii) a process capability ratio (CPK) between the measured coordinate and the respective reference coordinate, etc. Other examples of valves can include an upper control limit (UCL) and/or a lower control limit (LCL), which are bounds (e.g., limits) that are established by, for example, an engineering analysis using FEA, blueprint, statistics, etc. The averaged surface geometry map can subsequently be utilized to generate an averaged geometric part model, which can be compared to the geometric reference model to provide model comparison data. The model comparison data is indicative of one or more geometric differences between the models, which can be evaluated utilizing tolerances as described above.

While various embodiments of the present invention have been disclosed, it will be apparent to those of ordinary skill in the art that many more embodiments and implementations are possible within the scope of the invention. Accordingly, the present invention is not to be restricted except in light of the attached claims and their equivalents.

What is claimed is:

1. A method for inspecting a plurality of parts with an electronic measurement device and a processing system, comprising:
   creating surface geometry maps of the parts utilizing the electronic measurement device;
   comparing the surface geometry maps to one another to provide an averaged surface geometry map;
   generating an averaged geometric part model utilizing the averaged surface geometry map;
   comparing the averaged geometric part model to a geometric reference model to provide model comparison data indicative of geometric differences between the models; and
   evaluating the model comparison data to determine whether one or more of the geometric differences between the models respectively satisfy one or more predetermined geometric tolerances;
   wherein the comparing, the generating and the evaluating are performed by the processing system.

2. The method of claim 1, wherein the parts are manufactured utilizing a manufacturing device.

3. The method of claim 2, further comprising determining that the manufacturing device manufactures parts that comply with a part design specification where the deviation satisfies the geometric tolerances.

4. The method of claim 1, wherein:
   the geometric tolerances include at least one of a lower tolerance value and an upper tolerance value; and
   a first of the geometric differences between the models satisfies the predetermined geometric tolerances where a value of the first of the geometric differences between the models is at least one of greater than the lower tolerance value, and less than the upper tolerance value.

* * * * *